United States Patent
Stewart

(10) Patent No.: US 8,059,478 B2
(45) Date of Patent: Nov. 15, 2011

(54) LOW COST TESTING AND SORTING FOR INTEGRATED CIRCUITS

(75) Inventor: Roger G. Stewart, Hillsborough, NJ (US)

(73) Assignee: Kovio, Inc., Milpitas, CA (US)

(*) Notice: Subject to any disclaimer, the term of this patent is extended or adjusted under 35 U.S.C. 154(b) by 509 days.

(21) Appl. No.: 12/328,675

(22) Filed: Dec. 4, 2008

(65) Prior Publication Data

US 2011/0122718 A1    May 26, 2011

(51) Int. Cl.
 *G11C 29/00* (2006.01)
(52) U.S. Cl. .................................... 365/201; 324/763.01
(58) Field of Classification Search .................. 365/201; 324/763.01
 See application file for complete search history.

(56) References Cited

U.S. PATENT DOCUMENTS

| | | | |
|---|---|---|---|
| 3,813,650 | A | 5/1974 | Hunter |
| 5,734,819 | A | 3/1998 | Lewis |
| 6,380,729 | B1 | 4/2002 | Smith |
| 6,952,623 | B2 | 10/2005 | McAdams et al. |
| 7,299,388 | B2 | 11/2007 | Ung et al. |
| 7,307,528 | B2 | 12/2007 | Glidden et al. |
| 7,312,622 | B2 | 12/2007 | Hyde et al. |
| 2003/0221152 | A1 | 11/2003 | Volkerink et al. |
| 2006/0086805 | A1* | 4/2006 | Oozeki et al. ................. 235/492 |
| 2006/0125505 | A1 | 6/2006 | Glidden et al. |
| 2006/0125506 | A1 | 6/2006 | Hara et al. |
| 2006/0125507 | A1 | 6/2006 | Hyde et al. |
| 2007/0011518 | A1 | 1/2007 | Ung et al. |
| 2007/0218571 | A1 | 9/2007 | Stoughton et al. |
| 2007/0241766 | A1 | 10/2007 | Kamitai et al. |
| 2008/0088417 | A1* | 4/2008 | Smith et al. ................. 340/10.41 |

FOREIGN PATENT DOCUMENTS

JP    8-23016 A    1/1996

OTHER PUBLICATIONS

Noboru Mori, Masamitsu Shimazakiand Akira Okugaki; "Test of Semiconductor Memory"; esp@cenet; Abstract of Publication No. JP8023016A; Publication Date: Jan. 23, 1996; esp@cenet Database—Worldwide.

* cited by examiner

*Primary Examiner* — Vu Le
(74) *Attorney, Agent, or Firm* — The Law Offices of Andrew D. Fortney; Andrew D. Fortney; Sharon E. Brown Turner

(57) ABSTRACT

Methods of testing and sorting integrated circuits in clusters are disclosed. Each cluster has power and data terminals connected to common power and data busses providing a common power supply. Each integrated circuit has a first non-volatile memory storing an activation code and a second programmable non-volatile memory that is capable of storing the activation code. If an integrated circuit passes testing, the activation code stored in the first non-volatile memory is written into the second non-volatile memory. An integrated circuit is independently functional upon separation from the cluster if the codes in the first and second non-volatile memories match. Upon separation, integrated circuits are queried to determine which respond. Each integrated circuit includes logic adapted to determine whether the codes in the first and second non-volatile memories match. If the codes do not match, the logic permanently disables the integrated circuit upon separation from the cluster.

49 Claims, 5 Drawing Sheets

LOW COST TESTING AND SORTING FOR INTEGRATED CIRCUITS

RELATED APPLICATIONS

The present application may be related to co-pending U.S. application Ser. No. 12/329,302 filed on Dec. 5, 2008 and entitled "Deactivation of Integrated Circuits", which is incorporated herein by reference in its entirety.

FIELD OF THE INVENTION

The present invention generally relates to the field of integrated circuits and methods of manufacturing the same. More specifically, embodiments of the present invention pertain to integrated circuits, clusters thereof, and methods of testing and sorting such integrated circuits.

BACKGROUND

The present invention addresses the increasing proportion of integrated circuit testing costs relative to the integrated circuit fabrication costs. For example, thousands of integrated circuits can be fabricated at the same time on a single silicon wafer. However, each integrated circuit generally has to be tested serially (e.g., one at a time). Such serial operations are fundamentally more expensive than parallel operations. The industry has responded to this problem by (1) manufacturing more transistors and functionality onto each integrated circuit in order to amortize the testing cost over a larger number of transistors, (2) incorporating self-testing capability into the individual integrated circuits, and/or (3) testing multiple integrated circuits at the same time by mechanically probing multiple neighboring clusters of integrated circuits with complex probe card assemblies and hundreds of probe pads.

However, each of these solutions has disadvantages. First, many modern electronic systems (e.g., RFID tags, smart cards, or other embedded computer systems) require billions and perhaps even trillions of low-cost integrated circuits. Thus, it may be ineffective to increase the number of transistors and the functionality on each integrated circuit. Second, although integrated circuits may be able to self-test, individual mechanical test probes may still be required to provide necessary power and timing signals. This continues to limit the speed at which small integrated circuits can be tested. In addition, mechanical inking is also still necessary to identify integrated circuits that failed testing so that functional integrated circuits can be sorted after the scribe and dice operation. Third, the process of testing multiple neighboring clusters of integrated circuits using complex probe card assemblies having hundreds of probe pads dramatically increases the cost of the probe card, and also increases the likelihood of a probe malfunction. Furthermore, the number of integrated circuits in the cluster may be limited because simultaneous mechanical contact with each pad within the cluster is required. In turn, this limits the throughput increase to a value in the range of from 2× to 10×. Thus, need is felt for improved reliability of the integrated circuit testing process without increasing the testing costs, or preferably, while decreasing the costs of testing.

SUMMARY OF THE INVENTION

Aspects of the present invention relate to integrated circuits, integrated circuit clusters, and methods of testing and sorting integrated circuits. The cluster testing method of the present invention, coupled with a programmable non-volatile memory to locally store the test results on each individual integrated circuit, solves the above-described problems, and reduces testing costs. In addition, fabricating the integrated circuits in a naturally disabled condition, and requiring a proactive process to enable or activate them as disclosed herein, reduces the chance that a poorly functioning or non-functioning integrated circuit will pass undetected through the testing and evaluation process.

According to the present invention, in general, a plurality of integrated circuits are arranged in a cluster on a substrate. Each cluster has power and data terminals connected to common power and data busses, which provide common power supply and data signals to each integrated circuit in the cluster (e.g., during testing, prior to separating the integrated circuits in the cluster from each other). Each integrated circuit in the cluster has a first non-volatile memory that is adapted to store an activation (e.g., initiation) code. In addition, each integrated circuit has a second non-volatile memory that is programmable, and capable of storing the same activation code. In an initial (e.g., "virgin") state, the first and second non-volatile memories are different from (do not match) one another. Each integrated circuit will function independently if the first non-volatile memory and the second (programmable) non-volatile memory match. Thus, an integrated circuit is not independently functional in its initial state. However, the circuits are functional in the non-matching, virgin state when they are connected to one another in the cluster.

The circuits connected in the cluster are subject to various desired testing processes in parallel. For integrated circuits that pass testing, the activation code is written into the second programmable non-volatile memory. For integrated circuits that fail to receive the test signal(s), or circuits that fail one or more tests in the testing process, the activation code is not written into the second programmable non-volatile memory. The integrated circuits in the cluster are subsequently separated, and the common power and data busses are severed. The separated integrated circuits are queried to determine which circuits respond. For example, integrated circuits that pass testing have matching first and second non-volatile memories, and thus are independently functional. Therefore, these circuits will respond to the query. Integrated circuits that fail to respond to the query (e.g., those that do not have matching first and second non-volatile memories) are not independently functional, and may be discarded.

Each integrated circuit is connected to a neighboring integrated circuit by power and data busses to form a cluster of integrated circuits. Each integrated circuit is also equipped with logic adapted to detect or determine whether the code in the second programmable non-volatile memory matches the activation code stored in the first non-volatile memory. If the logic determines that the codes do not match, the logic may also be adapted to permanently disable the integrated circuit, so that any circuit with the non-matching codes will be non-functional when separated from the cluster.

The integrated circuits are arranged in clusters on a substrate (e.g., silicon wafer for conventional semiconductor processing, glass for thin-film transistor processing, etc.). Each cluster comprises a plurality of electrically interconnected integrated circuits. Each integrated circuit includes both cluster terminals and pad terminals. The pad terminals are similar to the input/output (I/O) pads of conventional integrated circuits and facilitate connection to test probes and, later after packaging, to power supplies, clocks, inputs, outputs, antennas, and other external devices. In contrast, the cluster terminals form a temporary connection between the integrated circuit and its cluster wiring, and are used only while the integrated circuit remains part of the cluster. The cluster wiring includes common power and data busses that provide the electrical interconnections between adjacent integrated circuits in the cluster. These power and data busses are coupled to at least one programmable non-volatile memory and to operating circuitry in each integrated circuit through these cluster terminals. The cluster terminals may be disconnected from the common power and data busses in the integrated circuits upon separation of the integrated circuits from one another.

By testing the integrated circuits within a cluster in parallel, the time and expense required for testing may be significantly reduced. In addition, by designing the integrated circuits to function independently (e.g., when separated from the cluster) only if the second programmable non-volatile memory matches the first non-volatile memory, the functionality of the circuit can be quickly determined with a simple select and/or query command sequence, preferably in less than 1 ms. This is considerably faster than a typical test operation which generally takes about 100 ms to complete, because test codes and/or patterns must be written into and erased from an EEPROM memory. This relatively fast and inexpensive method for screening integrated circuits can be used at any point in the manufacturing and/or distribution process to physically sort integrated circuits and determine which are functional and/or non-functional.

These and other advantages of the present invention will become readily apparent from the detailed description of preferred embodiments below.

DETAILED DESCRIPTION OF THE PREFERRED EMBODIMENTS

Figure 1:
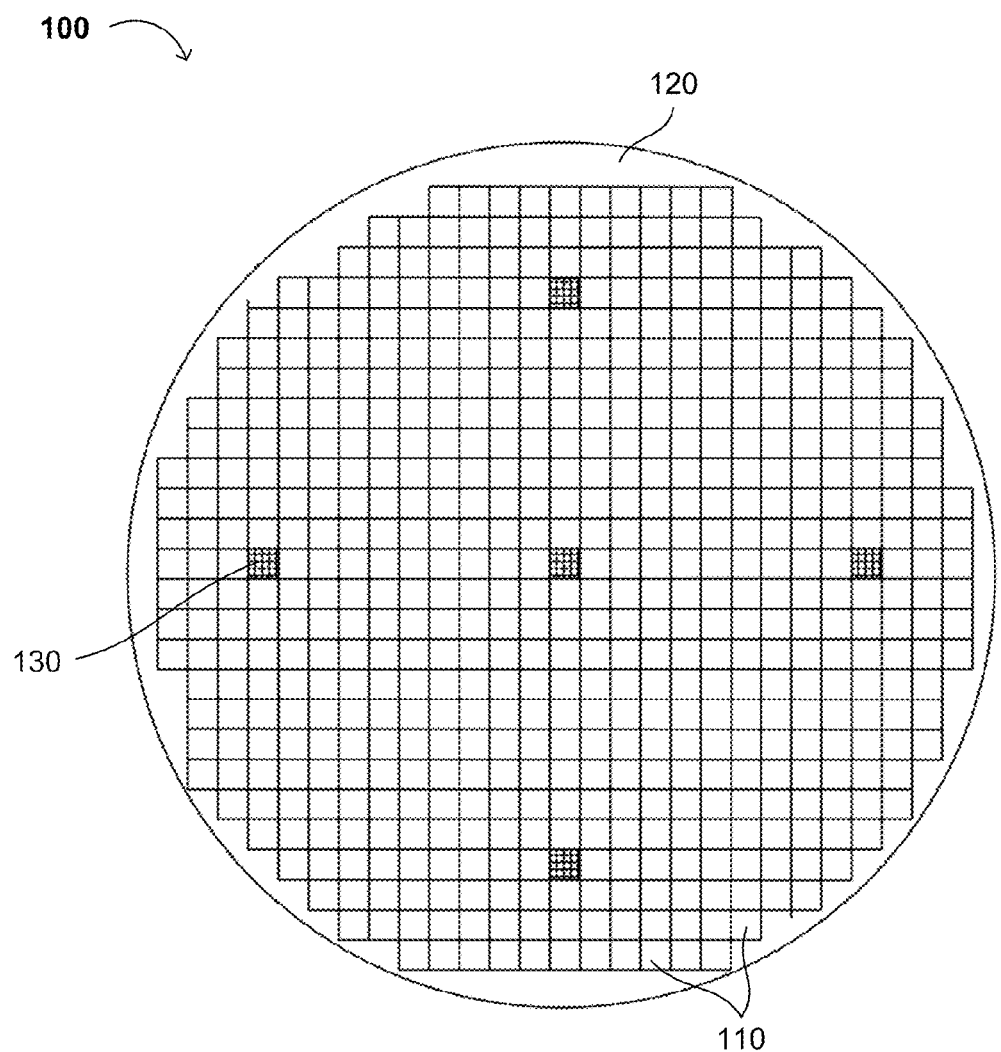
FIG. 1 is a top-down diagram showing approximately 600 integrated circuit clusters on a wafer/substrate according to the present invention.

Reference will now be made in detail to the preferred embodiments of the invention. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

For the sake of convenience and simplicity, the terms "integrated circuit," "tag," "chip," "die," "RF," "RFID," and "identification" may be used interchangeably with respect to intended uses and/or functions of a device and/or tag, and the term "tag" or "device" may be used herein to refer to any RF, RFID, and/or identification sensor, tag and/or device. Also, the terms "integrated circuit" and/or "integrated circuitry" refer to a unitary structure comprising a plurality of electrically active devices formed from a plurality of conductor, semiconductor and insulator thin films, but generally does not include discrete, mechanically attached components (such as die, wire bonds and leads, or an antenna and/or inductor component), or materials having primarily an adhesive function. In addition, the terms "item," "object" and "article" are used interchangeably, and wherever one such term is used, it also encompasses the other terms.

Some portions of the detailed descriptions which follow may be presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "operating," "computing," "calculating," "determining," or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. Similarly, for convenience and simplicity, the terms "data," "data stream," "waveform" and "information" may be used interchangeably, as may the terms "connected to," "coupled with," "coupled to," and "in communication with" (which may refer to direct or indirect connections, couplings, or communications), but these terms are generally given their art-recognized meanings herein.

Similarly, for convenience and simplicity, the terms "clock," "time," "timing," "rate," "period" and "frequency" are, in general, interchangeable and may be used interchangeably herein, but are generally given their art-recognized meanings. Further, a "tag" may refer to a single device or to a sheet, reel, and/or a spool comprising a plurality of attached structures, suitable for electronic article surveillance (EAS), high frequency (HF), ultrahigh frequency (UHF), radio frequency (RF) and/or RF identification (RFID) purposes and/or applications.

The present invention relates to integrated circuits, clusters of integrated circuits, and methods of testing and sorting the same. A first aspect of the present invention concerns a method of testing and sorting a plurality of integrated circuits in a cluster on a substrate (e.g., wafer). In the present method, each integrated circuit cluster has a set of temporary terminals ("cluster terminals") connected to common power and data busses providing common power supply and data signals to each integrated circuit in the cluster. In addition, each integrated circuit has a first non-volatile memory storing an activation (e.g., initiation) code and a second non-volatile memory that is programmable and capable of storing the same activation code. The circuits in the cluster are subject to a self-testing process in parallel, using the common power and data buses. For circuits that pass testing, the activation code in the first non-volatile memory is written into the second programmable non-volatile memory. If an integrated circuit either fails to receive the testing signal, or if the integrated circuit fails testing, the activation code is not written into the second programmable non-volatile memory. The integrated circuits in the cluster are then separated and the common power and data busses are severed. The separated integrated circuits are queried to determine which integrated circuits respond. Integrated circuits that respond to the query are independently functional, whereas those that fail to respond are non-functional, and thus are discarded.

In the present invention, a separated integrated circuit is functional when the code in the second programmable non-volatile memory matches the activation code stored in the first non-volatile memory. Similarly, a separated integrated circuit is non-functional when the code in the second programmable non-volatile memory does not match the code stored in the first non-volatile memory. In preferred embodiments, the initial code in the second programmable non-volatile memory does not match the activation code store in the first non-volatile memory. Thus, unless an integrated circuit receives and passes a test signal so that the activation code is written into the second programmable non-volatile memory, the codes in the first and second non-volatile memories will not match, and the integrated circuit will be non-functional upon separation from the cluster.

A second aspect of the present invention concerns an integrated circuit generally comprising a first non-volatile memory adapted to store an activation code, and a second non-volatile memory that is programmable and capable of storing the same activation code. In addition, the integrated circuit comprises power and data busses that connect the integrated circuit to other neighboring integrated circuits to form a cluster of integrated circuits. The power and data busses are each unconnected to a terminal configured for external transmission, but are adapted to test the integrated circuit when connected to such terminals. The integrated circuit further comprises logic adapted to detect or determine whether the code in the second programmable non-volatile memory matches the activation code stored in the first non-volatile memory. In addition, the logic may also be configured to permanently disable the integrated circuit when the code in the second programmable non-volatile memory does not match the activation code, and the integrated circuit has been separated from the cluster.

A third aspect of the present invention concerns a cluster of integrated circuits. Each cluster comprises a plurality of electrically interconnected integrated circuits. Each integrated circuit is adjacent to at least one other integrated circuit on a common substrate. The cluster comprises common power and data busses that provide electrical interconnections between adjacent integrated circuits in the cluster, and which are coupled to at least one programmable non-volatile memory, as well as to operating circuitry in each integrated circuit. The cluster also includes power supply and data pads (e.g., "cluster" pads/terminals) connected to the common power and data busses, configured to be disconnected from the common power and data busses upon separation of the integrated circuits within the cluster. Thus, the cluster terminals are intended to be temporarily operational while the integrated circuits are connected to other devices and/or integrated circuits on the common substrate, but non-operational after separating the integrated circuit(s) from the other devices and/or integrated circuits in the cluster (see, for example, test pads 530 in FIG. 5, discussed below). Each integrated circuit in the cluster also has permanent pad terminals configured to connect the integrated circuit to external devices, such as test probes, and after packaging, to power supplies, clocks, inputs, outputs, and/or antennas.

The invention, in its various aspects, will be explained in greater detail below with regard to exemplary embodiments.

Exemplary Methods of Testing and Sorting Integrated Circuits

A first aspect of the present invention relates to a method of testing and sorting integrated circuits. Generally, a plurality of integrated circuits in a cluster on a substrate, are subject to a testing process. Each cluster comprises a set of power and data terminals connected to common power and data busses that provide common power supply and data signals to each integrated circuit in the cluster. In addition, each integrated circuit has a first non-volatile memory storing an activation code, and a second non-volatile memory that is programmable (i.e., "second programmable non-volatile memory"), and is capable of storing the same activation code that is in the first non-volatile memory.

Upon testing (e.g., self-test sequence), each integrated circuit that receives and passes the functional test(s) uses the cluster interconnect to write the activation code in the first non-volatile memory into the second programmable non-volatile memory. If an integrated circuit either fails to receive the testing sequence or fails testing, the integrated circuit leaves its second non-volatile memory code unchanged. After the testing process, the integrated circuits in the cluster are separated, and the common power and data busses are permanently severed. Those integrated circuits that failed testing, and thus left the second non-volatile memory unchanged, are automatically and permanently disabled upon separation from the wafer.

Once separated from the cluster, an integrated circuit is only functional when the code in the second programmable non-volatile memory matches the activation code stored in the first non-volatile memory. If the codes do not match, the separated integrated circuit is non-functional. However, an integrated circuit will be functional regardless of whether the codes in the first and second non-volatile memories match, when the integrated circuit is connected to the other integrated circuits in the cluster. In some embodiments, the integrated circuits may comprise one or more logic circuits and/or one or more analog circuits. The logic may be adapted to determine whether the code stored in the second non-volatile programmable memory matches the activation code in the first non-volatile memory. Such logic is described in detail below with regard to exemplary integrated circuits.

In exemplary embodiments, all of the integrated circuits in a cluster are tested in parallel. Testing the integrated circuits may be accomplished by temporarily providing power, test data, and a clock signal to the cluster. Furthermore, in some embodiments, one or more test commands may be provided to a tester configured to test the cluster. In preferred embodiments, as part of the wafer probe activation/initiation test sequence, the tester temporarily provides power, clocking, commands, and data as needed to enable each integrated circuit within the cluster to test itself including its logic circuits, analog circuits, and particularly the second programmable non-volatile memory (e.g., EEPROM), which requires relatively more time to WRITE and ERASE a full set of test patterns. However, in the present method, this testing process may be approximately 200 times faster than serial testing methods known in the art, because the tests can be conducted on up to 252 integrated circuits at one time within the cluster. Integrated circuit clusters and the arrangement of such clusters on a substrate/wafer are described below with regard to Exemplary Clusters of Integrated Circuits.

The testing process may also utilize wafer acceptance test key blocks to ensure reliability and uniformity in the testing process. As shown in FIG. 1, a plurality of wafer acceptance test key blocks 130 are arranged among the clusters of integrated circuits 110 on a substrate/wafer 120. The wafer acceptance test key blocks (e.g., patterns) monitor production parametric parameters by determining if predetermined and/or established base parameters of test structures formed on the wafer are within acceptable ranges.

As previously discussed, the present method comprises writing the activation code stored in the first non-volatile memory into the second programmable non-volatile memory of those integrated circuits that pass testing, and not writing the activation code into the second programmable non-volatile memory of those integrated circuits that do not pass testing. After an integrated circuit is separated from its cluster, it is only functional if the codes in the first and second non-volatile memories match one another. However, while the integrated circuits are connected to each other in the cluster, they are functional whether the activation code in the first non-volatile memory matches or does not match the code in the second non-volatile memory.

In preferred embodiments, the activation code in the first non-volatile memory does not match the initial code stored in the second programmable non-volatile memory in an initial/virgin state. Consequently, if an integrated circuit fails testing, or fails to receive the testing signal, the activation code in the first non-volatile memory is not written into the second programmable non-volatile memory, and they remain in a non-matching state. Thus, the failing and/or non-tested integrated circuits are not functional upon separation from the cluster. On the other hand, if an integrated circuit passes testing, the activation code is written into the second programmable non-volatile memory, so that the codes match. The matching codes render the passing integrated circuits independently functional upon separation from the cluster.

After the steps of testing and writing/not-writing the activation code into the second programmable non-volatile memory are complete, the integrated circuits are separated from one another and the common power and data busses are permanently severed. The integrated circuits may be separated by scribing or etching the cluster in spaces between the individual integrated circuits. However, the separating step is not limited as such. The integrated circuits may be separated by any process well known in the art.

After the integrated circuits are separated, they are queried to determine which integrated circuits respond. Querying may comprise sending a select/query command to the separated integrated circuits. Preferably, querying is performed for less than 1 ms, roughly 100 times faster than a test of the chip's non-volatile memory. In some embodiments, querying comprises reading the first and/or second non-volatile memory of the separated integrated circuits. In further embodiments, querying may include transmitting a radio frequency, wireless, or optical signal to the separated integrated circuits, or otherwise communicating with the integrated circuits using any other method well known in the art. Integrated circuits that respond to the query are independently functional, which indicates that the integrated circuit passed the testing. Those that fail to respond either did not test, or failed testing, and thus are not independently functional. Integrated circuits that do not respond may be discarded. This inexpensive and fast screening process can be used at any point in the manufacturing and/or distribution process to physically sort out poorly functioning integrated circuits.

Figure 2:
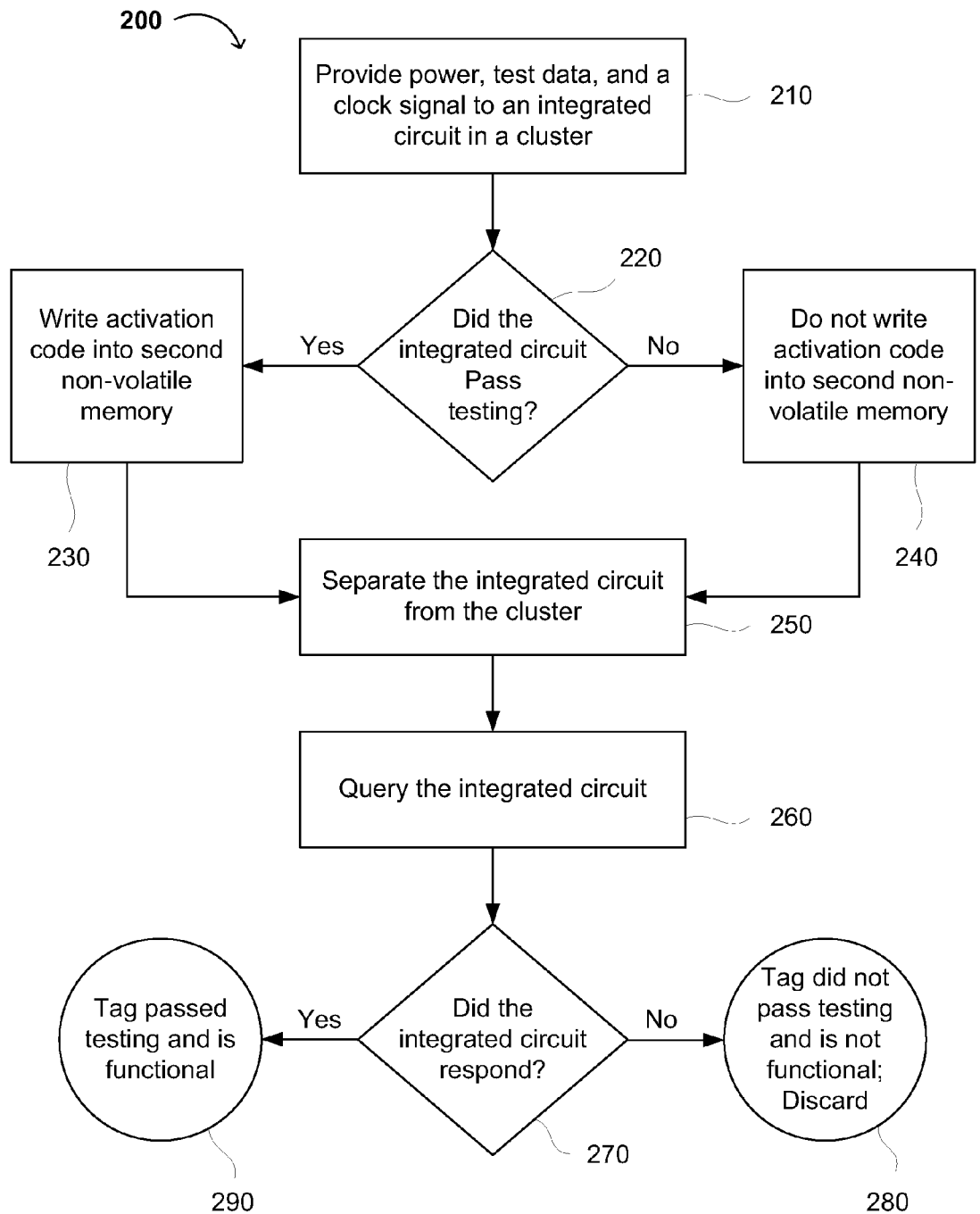
FIG. 2 shows an exemplary process flow, in accordance with the present method.

An exemplary process flow 200 for the present method is shown in FIG. 2. An integrated circuit in a cluster may be tested by providing power, test data, and a clock signal to the integrated circuit, as shown in step 210. Next, it is determined whether the integrated circuit passed the testing (see decision box 220). If the integrated circuit passed testing, the activation code stored in the first non-volatile memory is written into the second programmable non-volatile memory, as shown in step 230. If the integrated circuit did not pass testing, the activation code is not written into the second non-volatile memory (see step 240). The integrated circuit is then separated from the cluster (see step 250) and the integrated circuit is queried (see step 260) to determine if the integrated circuit responds (see decision box 270). If the integrated circuit responds to the query, the integrated circuit passed testing and is functional (see step 290). If the integrated circuit does not respond to the query, the integrated circuit did not pass testing. Thus, the integrated circuit is not functional, and should be discarded (see step 280).

Exemplary Integrated Circuits

Another aspect of the present invention relates to integrated circuits (e.g., wireless transponders, RFID devices, etc.). Generally, an integrated circuit of the present invention comprises a first non-volatile memory adapted to store an activation code, and a second non-volatile memory that is programmable and capable of storing the same activation code. The integrated circuit further comprises power and data busses, each of which is connected to a terminal configured for external transmission. The power and data busses connect the integrated circuit to other neighboring integrated circuits to form a cluster of integrated circuits. In addition, the integrated circuit comprises logic adapted to detect or determine whether the code in the second programmable non-volatile memory matches an activation code (e.g., unique ROM code) stored in the first non-volatile memory. The logic may also be configured to permanently disable the integrated circuit when the code in the second programmable non-volatile memory does not match the activation code, and the integrated circuit has been separated from its cluster.

In some embodiments, the first non-volatile memory comprises a ROM memory and the activation code may comprise a unique ROM code. Although a 16-bit ROM code is described in the embodiment shown in FIG. 4, different lengths of ROM code could be used instead of 16. This may include using only a single bit (or logic connection) for the ROM code, as long as that one bit (or logic connection) is different from the un-programmed bit (or state) initially present in the second non-volatile memory. For example, first and second single-bit non-volatile memory codes could be compared by applying the second non-volatile memory bit to a logic gate. In this case the presence (or absence) of an inverter at the input of said logic gate constitutes the first ROM code or activation code. In 16-bit embodiments, each cluster of integrated circuits may have a unique 8-bit ROM coded number that is associated with the cluster, and which is identical for each integrated circuit in the cluster. In such embodiments, the activation code of each integrated circuit in the cluster may comprise the unique 8-bit ROM coded number that is associated with the cluster, along with an 8-bit ROM code that is unique to the individual integrated circuit.

The second programmable non-volatile memory may comprise an EEPROM memory, or any other form of non-volatile storage known in the art (e.g., once-programmable memory, fuses, anti-fuses, etc). In exemplary embodiments, the second programmable non-volatile memory comprises at least 16 bits. In other preferred embodiments, the test results may be stored in the second programmable non-volatile memory. For example, as previously explained herein with regard to exemplary methods for testing integrated circuits, the activation code is written into the second programmable non-volatile memory if an integrated circuit passes the testing, which renders the integrated circuit functional after separation from the cluster. On the other hand, the activation code is not written into the second programmable non-volatile memory if the integrated circuit fails the testing or does not receive the testing signal(s). This renders a failing and/or non-tested integrated circuit non-functional after separation from the cluster.

In an exemplary embodiment, the activation code stored in the first non-volatile memory is different than the code in the second programmable non-volatile memory prior to testing the circuit, and subsequent programming that may result from a passing testing result described herein. As previously explained, the activation code preferably comprises a unique ROM code, and preferably comprises $2^m$ bits, where m is greater than or equal to 3. When connected in the cluster, the integrated circuit is fully functional. However, when separated from the cluster, the integrated circuit is only functional when the activation code in the first non-volatile memory matches the second programmable non-volatile memory.

The substrate of the integrated circuit may be a single crystal silicon substrate, or in the alternative, a thin-film-transistor substrate. In embodiments comprising a single crystal silicon substrate, some of the power and data busses are preferably formed as diffusion layers in the substrate. In embodiments including a thin-film-transistor substrate, the power and data busses each comprise a polysilicon layer, a metal layer, or a capacitor on the substrate.

Figure 3:
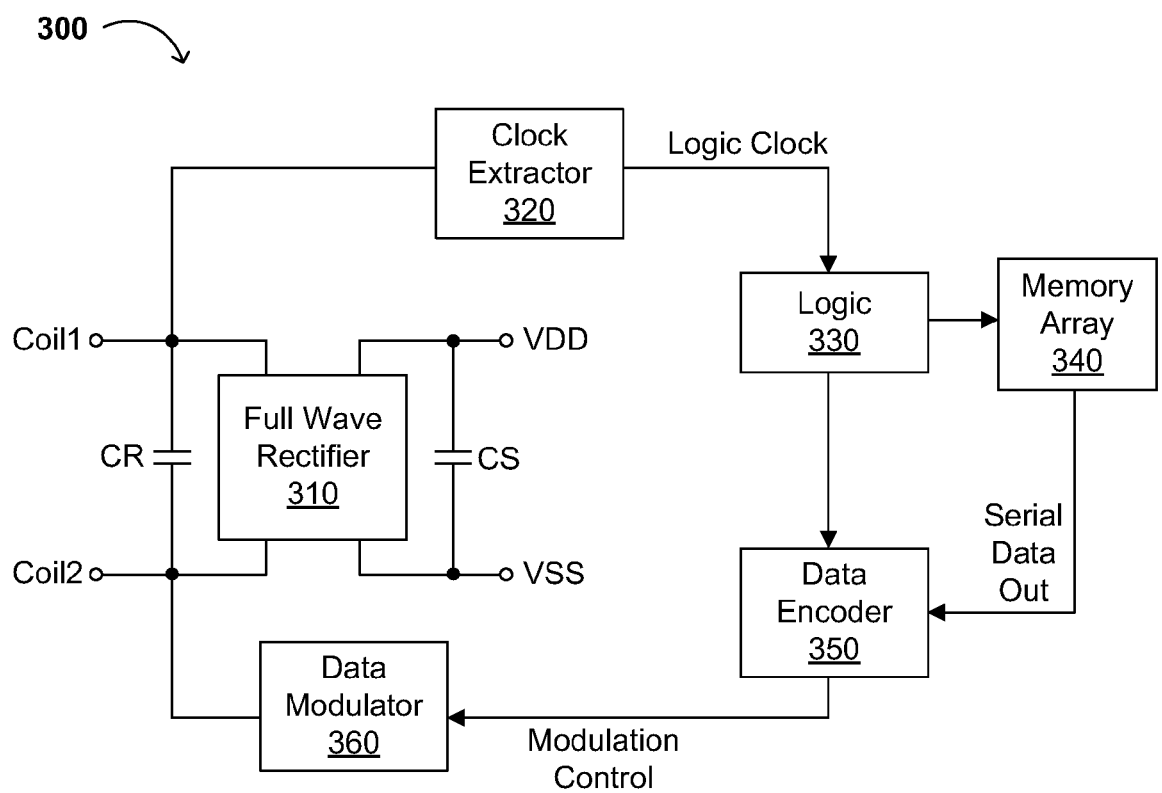
FIG. 3 is an exemplary block schematic diagram showing an integrated circuit (e.g., RFID) design suitable for use in accordance with embodiments of the present invention.

In preferred embodiments, the integrated circuit further includes self-test circuitry (e.g., built-in self-test circuitry (BIST)). Additionally, the integrated circuit may have circuitry adapted to disable some or all of the operational circuitry when the activation code does not match the code in the second programmable non-volatile memory. For example, FIG. 3 shows an exemplary block schematic diagram of an RFID design including various functional blocks that can be disabled if the activation and second programmable non-volatile memory codes do not match. In one exemplary embodiment, the full wave rectifier 310 may be disabled. In another embodiment, the clock extractor 320 may be disabled. In other variations, the data modulator 360, the data encoder 350, the memory array 340 and/or the logic 330 may be disabled. While it may be preferable to disable the full wave rectifier 310, the clock extractor 320, or the data modulator 360, any functional blocks, or any combination of functional blocks may be disabled if the activation code does not match the code in the second programmable non-volatile memory.

Figure 4:
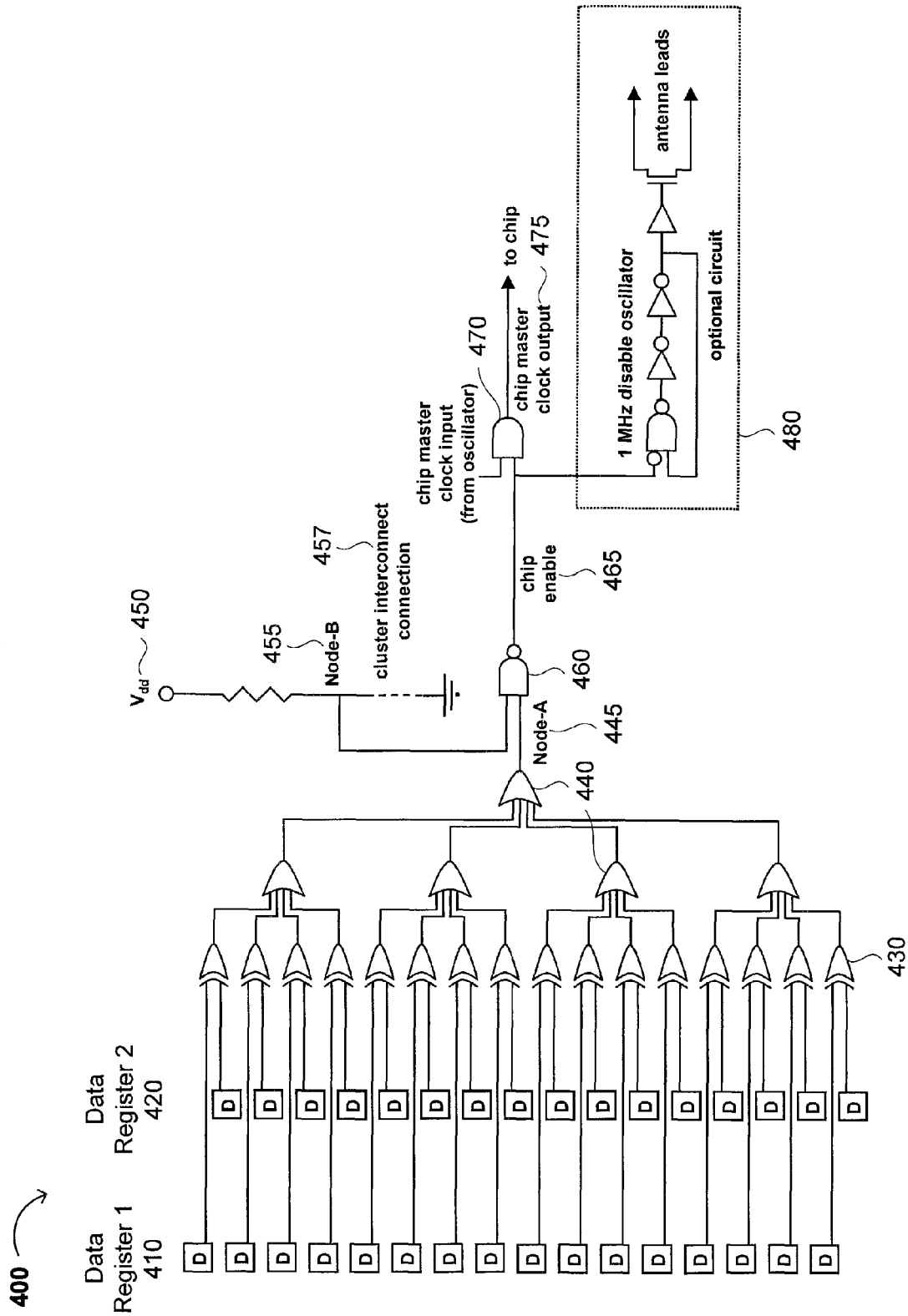
FIG. 4 is a schematic diagram of a logic gate showing logical operations performed in the integrated circuit testing process.

In exemplary embodiments, the integrated circuit comprises logic configured to permanently disable the integrated circuit if the activation code stored in the first non-volatile memory does not match the code stored in the second programmable non-volatile memory. FIG. 4 provides an electrical circuit diagram showing the logic used in the testing and sorting process described herein. Included in the diagram are two 16-bit data registers 410 and 420. The first data register 410 represents the first non-volatile memory (e.g., 16-bit ROM register) and the second data register 420 represents the second (programmable) non-volatile memory (e.g., EEPROM register). In preferred embodiments, the first data register may be programmed only during manufacturing and may not be changed. This register stores the activation code for the integrated circuit. Preferably each integrated circuit within a cluster has a unique activation code that is different from any other integrated circuit within that cluster.

Programming the unique activation code during the manufacturing process may be achieved by programming $2^n$ bits of the first data register, where n is at least 3, to ensure that each integrated circuit within the cluster contains a number that is unique to the cluster (e.g., "the unique cluster number"). In preferred embodiments, the remaining bits of the first data register in each integrated circuit are programmed to ensure that the activation code includes 3 or more zeroes and/or 3 or more ones (e.g., 4 or more, 5 or more, etc.). For example, in one exemplary implementation, 8 of the 16 register bits are programmed with the unique cluster number, and the remaining 8 bits are programmed to ensure that the 16-bit activation code includes at least 5 zeroes and/or 5 ones.

Although it may be preferable for each integrated circuit to have a unique activation code relative to the other integrated circuits in the cluster, this is not required. It is only important to ensure that the factory-programmed first data register (i.e., first non-volatile memory) is unlikely to perfectly match the initial (e.g., unprogrammed) code stored in the second data register (i.e., second programmable non-volatile memory).

The second data register 420 of FIG. 4 includes a 16-bit activation code space within its memory (e.g., EEPROM) register that is similar to that of the first data register. However, in its initial state, this data register should not match the activation code stored in the first data register 410. Preferably, the initial code in the second data register (e.g., second non-volatile memory) will initially comprise all zeroes or all ones. If necessary the second programmable non-volatile memory can be UV erased to one of those preferred states.

FIG. 4 further illustrates how the integrated circuit may be designed to operate only when the first and second data registers (e.g., first and second non-volatile memories) match. The integrated circuit includes an array of Exclusive-OR (XOR) gates 430, which detect any differences between each corresponding bit stored in the first data register 410 and the second data register 420. If any difference is detected, the XOR gate provides a logic "1" output. The output of each of the XOR gates is received by an OR gate 440 and the output at Node-A 445 will go to a logic "1" state if any mismatch is detected between the contents of the 16-bit first data register (i.e., 410) and the second 16-bit data register (i.e., 420).

Initially the $V_{dd}$ (i.e., the logic "1" state) 450 is distributed through the cluster interconnect busses 457 to one input of a NAND gate 460. This keeps the integrated circuit enabled regardless of the content of the two 16-bit data registers. The integrated circuit functions are not affected by any mismatch in the two data registers as long as the integrated circuit remains on the wafer, and the cluster interconnections remain intact. As long as the cluster interconnects 457 are preserved, Node-B 455 remains low and the integrated circuit enable control 465 at the output of the subsequent NAND gate 460 remains in the logic "1" state independently of the state of Node-A 445.

Once the cluster interconnects are severed, Node-B 455 goes to the logic "1" state, and the integrated circuit enable 465 becomes responsive to any differences between the first data register 410 and its corresponding portion of the second data register 420. If a mismatch is detected, the integrated circuit enable node 470 is driven to logic "0", which then shuts down the master clock 475. Thus the integrated circuit is permanently disabled. On the other hand, when a mismatch is not detected, the enable node 470 allows the clock input to pass through so that the integrated circuit is provided with a master clock signal, which allows the integrated circuit to function. Consequently, in the preferred embodiment, the integrated circuit has been deliberately designed to become disabled once the integrated circuit has been separated from the silicon wafer on which it was fabricated if it remains unchanged and in its initial state. This is because the first 16-bit data register and the second 16-bit data register do not match in an initial memory state, and the integrated circuit is not capable of operating independently of the cluster interconnect in such an initial state. Only if the code in the first data register is written into the second data register (i.e., the integrated circuit passes testing) will the integrated circuit be functional after severance from the cluster.

In other embodiments, and as previously discussed herein, the integrated circuit may be disabled not only by shutting down its master clock (e.g., clock extractor), but also by blocking certain commands, disabling the full wave rectifier and/or data modulator, or by any other techniques known in the art (e.g., disabling any of the functional blocks described herein, etc.). In applications where privacy is not a concern, the disabled state could contain a marker like the optional 1 MHz weak load modulation oscillator 480 shown in FIG. 4. When the integrated circuit enable node 470 is driven to logic "0," this optional circuit provides a vibrating frequency signal indicating that the integrated circuit is not enabled. This may be used to identify and discard non-functional integrated circuits/tags.

While FIG. 4 shows an exemplary embodiment of the present invention, those of ordinary skill in the art can appreciate that the circuit can be implemented in any number of ways. For example, according to FIG. 4, the circuit comprises 4 input OR gates. However, in various embodiments, the circuit may comprise 2-input or 3-input OR gates. Alternatively or additionally, the circuit may use exclusive NOR gates, AND gates, NAND gates, and/or inverters.

Exemplary Clusters of Integrated Circuits

Additional aspects of the present invention relate to clusters of integrated circuits. According to the present invention, in general a cluster of integrated circuits comprises a plurality of electrically interconnected integrated circuits. Each integrated circuit is adjacent to at least one other integrated circuit in the cluster on a substrate and/or wafer. The cluster has common power and data busses that provide electrical interconnections between adjacent integrated circuits in the cluster. The common power and data busses are coupled to at least one programmable non-volatile memory and to operating circuitry in each integrated circuit via the cluster terminals on the integrated circuit that are configured to be disconnected from the common power and data busses upon separation of the integrated circuits from the cluster. In preferred embodiments, the common power and data terminals may consist of a plurality of probe pads for routing external power supplies, clock inputs, and data to all of the integrated circuits in the cluster.

In some preferred embodiments, each cluster includes about 250 integrated circuits. In other implementations, a cluster may have as few as two or as many as thousands of integrated circuits. It may also be possible to have clusters of integrated circuits within clusters of integrated circuits. In the embodiment shown in FIG. 5, each cluster has a maximum size of 6.9 mm×6.9 mm so that each cluster will fit within a single stepper field of a photolithography tool. In some variations, the distance between adjacent integrated circuits of one cluster may be different than the distance between adjacent integrated circuits in another cluster on the substrate.

In general, a substrate (e.g., wafer) supports a plurality of clusters, each of which includes a plurality of integrated circuits. Preferably, there are no fewer than 100 and no more than 1,000 clusters on a single substrate. Referring again to FIG. 1, an exemplary arrangement of clusters on a substrate/wafer is provided. Specifically, FIG. 1 provides a top down view of approximately 600 integrated circuit clusters 110 arranged on a wafer substrate 120. The substrate 120 may have a size of, e.g., from 100 mm to 300 mm. In one exemplary embodiment, each cluster is 6.9 mm×6.9 mm, and contains approximately 252 integrated circuits. Each integrated circuit within a cluster may have a size of from 100-1,000 µm. In a preferred embodiment, the integrated circuits in the cluster are 420 µm×420 µm, and are interconnected to one another. Thus, a typical 200 mm wafer may contain 150,000 or more integrated circuits. A cluster size of 6.9 mm×6.9 mm is used in this embodiment because this size allows the cluster to fit within a single stepper field of a photolithography tool.

While FIG. 1 illustrates an exemplary arrangement of clusters on a round (e.g., silicon) wafer, the invention is not limited as such. In other exemplary methods, the substrate may comprise square or flexible substrate, or any other type of substrate known in the art. In addition, the substrate is not limited to a wafer. On the contrary, the cluster can be formed and tested on any suitable substrate known in the art, including but not limited to glass (e.g., quartz) sheets, wafers, slips, plastic and/or metal foils or slabs, silicon wafers, etc.

In one variation, the substrate comprises a single crystal silicon substrate. In this variation, the common power and data bus connections between adjacent integrated circuits in the cluster each comprise a diffusion layer in the substrate. In another variation, the substrate comprises a thin-film-transistor substrate. In this implementation, the common power and data bus connections between adjacent integrated circuits in the cluster each comprise a polysilicon layer, a metal layer, or a capacitor on the substrate, formed in the same layer as one or more of the layers in the TFT. However, these are only exemplary variations. For example, the techniques described herein may be applied to other semiconducting devices such as GaAs, organic TFTs, SnO, etc.

Each integrated circuit in the cluster has a first non-volatile memory that stores an activation code (e.g., unique ROM code), and a second non-volatile memory that is programmable, and capable of storing the same activation code. Upon separation from the cluster each integrated circuit is functional only when the codes in the first and second non-volatile memories match one another. However, the integrated circuits are always functional when connected in the cluster.

In exemplary embodiments, the initial code in the second programmable non-volatile memory is different from the activation code stored in the first non-volatile memory. Preferably, the initial code comprises all ones or all zeroes. In some embodiments, the first non-volatile memory comprises a ROM memory, and/or at least 8 bits. In preferred embodiments, the second programmable non-volatile memory comprises an EPROM or EEPROM memory, a once-programmable memory, fuses, anti-fuses, or other forms of non-volatile storage. After separation from the cluster, the integrated circuits are non-functional when the codes in the first and second non-volatile memories are different. Thus, integrated circuits that do not pass testing, and therefore do not write the activation code into the second non-volatile memory, are permanently disabled when separated from the cluster.

In one variation, each cluster has a unique 8-bit ROM coded number, which is identical for each integrated circuit in the cluster. The activation code (e.g., unique ROM code) of each integrated circuit in the cluster comprises the 8-bit ROM code that is unique to the cluster, and an 8-bit ROM code that is unique to the integrated circuit. In some embodiments, the activation code has at least three 0s and three 1s. Preferably, each integrated circuit has a unique activation code so that each integrated circuit within the cluster has a different activation code than all of the others in the cluster.

In some implementations, each integrated circuit in the cluster also has logic adapted to determine whether the activation code stored in the second programmable non-volatile memory matches the code stored in the first non-volatile memory. In addition, each integrated circuit may also have circuitry adapted to disable some or all of the operating circuitry when the activation code stored in the second programmable non-volatile memory does not match the activation code stored in the first non-volatile memory.

The common power and data busses provide electrical interconnections between adjacent integrated circuits in the cluster. When the substrate supporting the cluster is a single crystal silicon substrate, some of the electrical interconnections between the integrated circuits are preferably formed as diffusion layers in the substrate. If the substrate is a thin film transistor (TFT) substrate, the electrical interconnections may each comprise a polysilicon layer, a metal layer, or a capacitor on the substrate.

Figure 5:
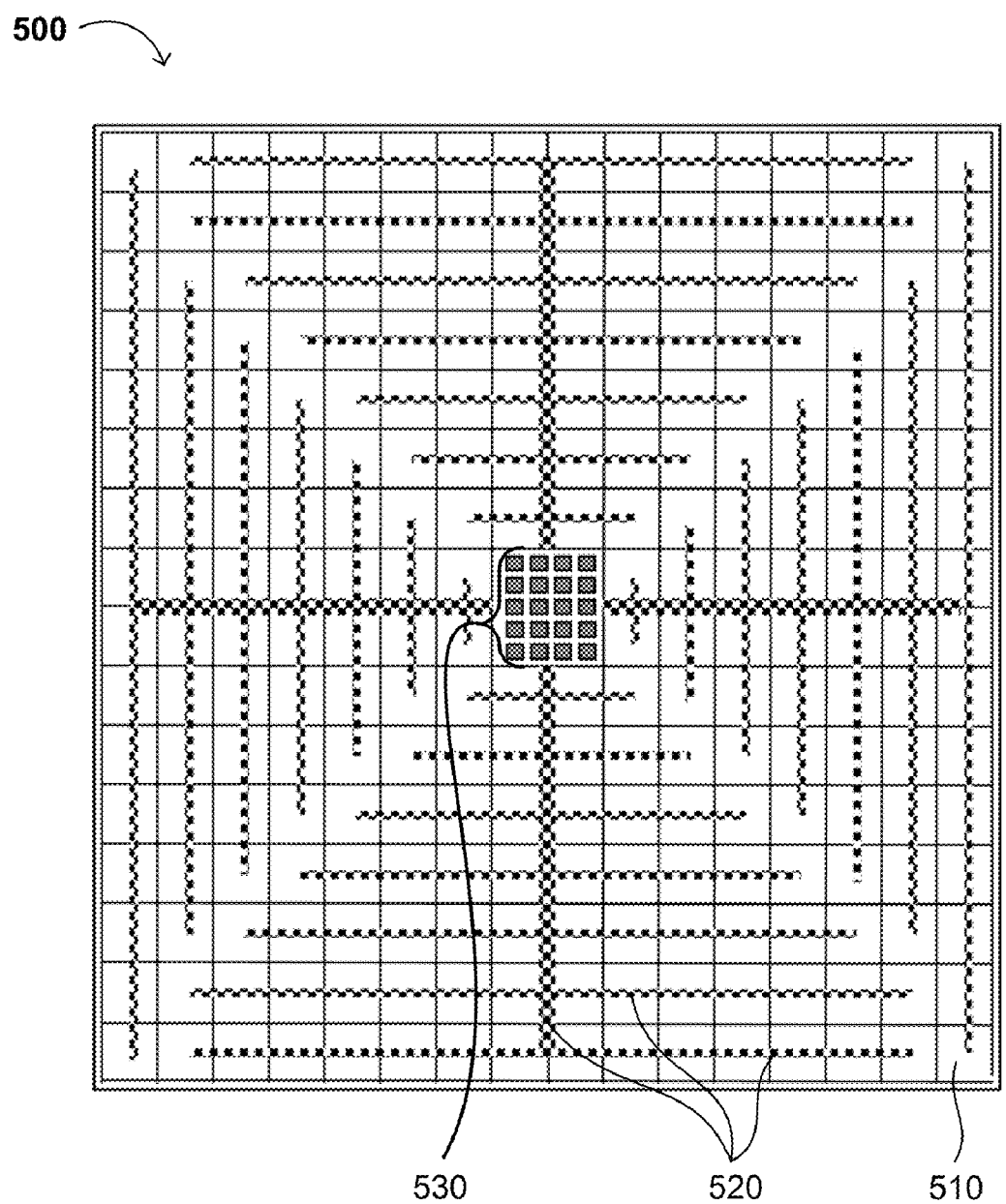
FIG. 5 is a top-down diagram showing integrated circuits (e.g., RFID chips) interconnected in a typical cluster according to the present invention.

FIG. 5 shows a top-down view of a typical 6.9 mm cluster layout 500 according to the present invention. Shown are approximately 252 integrated circuits (e.g., RFID chips) 510, each of which is 420 μm×420 μm. The integrated circuits 510 are connected to an array of cluster/test pads 530 by electrical interconnections 520 (e.g., power and signal line busses). The cluster/test pad array 530 has replaced four of the integrated circuit locations in the center of the cluster. The test pads allow the test probe to power up and initiate the self-testing process for the plurality of integrated circuits (e.g., the 252 RFID chips) within the cluster. The power supplies, clock, and self-test trigger signals are distributed outward from the test pads in the center of the cluster to all of the integrated circuits connected within the cluster. Preferably, the power and signal line busses are distributed using only the diffusion and polysilicon layers to ensure that they are later severed during the integrated circuit separation process. However, in alternative embodiments, the cluster interconnections may also be provided on a thin-film-transistor (TFT) or silicon-on-insulator (SOI) substrate using other conductive layer or capacitance structures.

CONCLUSION/SUMMARY

Thus, the present invention provides methods of testing and sorting integrated circuits, integrated circuits, and clusters of integrated circuits. The present invention addresses the problem associated with increasing proportion of integrated circuit testing costs relative to the integrated circuit fabrication costs. One possible reason for the discrepancy may be that thousands of integrated circuits can be fabricated simultaneously on a single wafer/substrate, but each integrated circuit must be tested serially one at a time. The present invention addresses this problem by disclosing methods for testing and sorting clusters of integrated circuits in parallel, and designing the integrated circuits so that they will not work independently in an initial or virgin state.

The cluster testing method of the present invention, coupled with the use of a programmable non-volatile memory to locally store the test results on each individual integrated circuits will solve the above-described problems, and will reduce testing costs. In addition, fabricating the integrated circuits in a naturally disabled condition, and requiring a proactive process to enable or activate them, reduces the chance that a poorly or non-functioning integrated circuit will pass undetected through the test and evaluation process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of testing and sorting integrated circuits comprising:
 a) testing a plurality of integrated circuits in a cluster on a substrate, each cluster having external power and data terminals connected to common power and data busses providing common power supply and data signals to each integrated circuit in the cluster, each integrated circuit having a first non-volatile memory storing an activation code and a second non-volatile memory that is programmable and capable of storing the same activation code;
 b) writing the activation code into the second programmable non-volatile memory of those integrated circuits that pass testing and not writing the activation code into the second programmable non-volatile memory of those integrated circuits that do not pass testing;

c) separating the integrated circuits in the cluster and severing the common power and data busses;

d) querying the separated integrated circuits to determine which integrated circuits respond; and e) discarding the integrated circuits that do not respond.

2. The method of claim 1, wherein the first non-volatile memory comprises a ROM memory.

3. The method of claim 1, wherein the second programmable non-volatile memory comprises an EEPROM memory.

4. The method of claim 1, wherein testing the plurality of integrated circuits comprises temporarily providing power, test data, and a clock signal to the cluster.

5. The method of claim 1, wherein each of the integrated circuits comprises one or more logic circuits and one or more analog circuits.

6. The method of claim 1, wherein the power and data terminals comprise two power supply pads and a data pad.

7. The method of claim 1, further comprising storing the test results in the second programmable non-volatile memory.

8. The method of claim 1, comprising testing all of the integrated circuits in the cluster in parallel.

9. The method of claim 1, wherein the cluster comprises more than 100 integrated circuits.

10. The method of claim 1, wherein the same activation code is stored in both the first and the second programmable non-volatile memory.

11. The method of claim 1, wherein each activation code is different from all other activation codes within the cluster.

12. The method of claim 1, wherein a separated integrated circuit is functional when the code in the second non-volatile memory matches the code in the first non-volatile memory and non-functional when the code in the second non-volatile memory does not match the code in the first non-volatile memory.

13. The method of claim 12, wherein each of the plurality of integrated circuits further comprises logic adapted to determine whether the code stored in the second non-volatile memory matches the code in the first non-volatile memory.

14. The method of claim 12, wherein the integrated circuit is functional when the integrated circuit is connected to the other integrated circuits in the cluster, whether the code in the second non-volatile memory matches or does not match the code in the first non-volatile memory.

15. The method of claim 1, wherein each of the plurality of integrated circuits in the cluster is adjacent to at least one other integrated circuit in the cluster, and each integrated circuit is electrically coupled to the other integrated circuits in the cluster.

16. The method of claim 15, wherein the substrate comprises a single crystal silicon substrate and common power and data bus connections between adjacent integrated circuits in the cluster each comprise a diffusion layer in the substrate.

17. The method of claim 15, wherein the substrate comprises a thin-film-transistor substrate and common power and data bus connections between adjacent integrated circuits in the cluster each comprise a polysilicon layer, a metal layer or a capacitor on the substrate.

18. The method of claim 1, wherein the substrate supports a plurality of clusters.

19. The method of claim 18, wherein the substrate supports from no fewer than 100 and no more than 1,000 clusters.

20. The method of claim 18, wherein a distance between adjacent integrated circuits of one cluster is different than a distance between adjacent integrated circuits in another cluster on the substrate.

21. The method of claim 1, wherein writing the activation code into the second programmable non-volatile memory renders the integrated circuits functional after separation from the cluster.

22. The method of claim 1, wherein not writing the activation code into the second programmable non-volatile memory renders the integrated circuit permanently disabled after its separation from the cluster.

23. The method of claim 1, comprising not writing the activation code into the second programmable non-volatile memory of integrated circuits that fail to receive and pass the test sequence.

24. The method of claim 1, wherein separating the integrated circuits comprises scribing or etching the cluster in spaces between the individual integrated circuits.

25. The method of claim 1, wherein querying is performed for less than 1 ms.

26. The method of claim 1, wherein querying the separated integrated circuits comprises wireless or optical communication with the separated integrated circuits.

27. An integrated circuit, comprising:
a) a first type of non-volatile memory adapted to store an activation code;
b) a second type of non-volatile memory that is programmable and capable of storing the same activation code;
c) power and data busses, each of which is unconnected to a terminal configured for external transmission, connecting the integrated circuit to other neighboring integrated circuits to form a cluster; and
d) logic adapted to (i) detect or determine whether the code in the second programmable non-volatile memory matches the activation code stored in the first non-volatile memory, and (ii) permanently disable the integrated circuit when the code in the second programmable non-volatile memory does not match the activation code and the integrated circuit has been separated from the cluster.

28. The integrated circuit of claim 27, wherein the second programmable type of non-volatile memory comprises an EEPROM memory.

29. The integrated circuit of claim 28, wherein the first type of non-volatile memory is a ROM.

30. The integrated circuit of claim 28, wherein the activation code is always different than the code in the second programmable type of non-volatile memory prior to being programmed.

31. The integrated circuit of claim 27, further comprising self-test circuitry.

32. The integrated circuit of claim 27, comprising a single crystal silicon substrate, and the power and data busses are formed as diffusion layers in the substrate.

33. The integrated circuit of claim 27, wherein the integrated circuit comprises a wireless transponder.

34. The integrated circuit of claim 27, wherein the integrated circuit comprises a RFID device.

35. A cluster of integrated circuits, comprising:
a) a plurality of electrically interconnected integrated circuits, each integrated circuit being adjacent to at least one other integrated circuit on a substrate;
b) common power and data busses, providing electrical interconnections between adjacent integrated circuits in the cluster, coupled to at least one programmable non-volatile memory and to operating circuitry in each integrated circuit, and configured to be disconnected from the integrated circuits upon separation of the integrated circuits; and
c) power supply and data pads connected to the common power and data busses, configured to be disconnected from the common power and data busses upon separation of the integrated circuits.

36. The cluster of claim 35, wherein the cluster comprises at least 100 integrated circuits.

37. The cluster of claim 35, wherein each integrated circuit comprises a first non-volatile memory adapted to store an activation code, and a second non-volatile memory that is programmable and capable of storing the same activation code.

38. The cluster of claim 37, wherein the second programmable non-volatile memory comprises an EEPROM memory.

39. The cluster of claim 37, wherein the first non-volatile memory comprises at least 8 bits.

40. The cluster of claim 37, wherein the activation code has at least three 0s and three 1s.

41. The cluster of claim 35, wherein the activation codes of each of the plurality of integrated circuits are all different from each other.

42. The cluster of claim 35, wherein, after separation, the integrated circuits are functional only when the code stored in the second programmable non-volatile memory is the same as the activation code stored in the first non-volatile memory.

43. The cluster of claim 35, wherein, after separation, the integrated circuits are functional only when the code stored in the second programmable non-volatile memory does not match a code initially present in the first non-volatile memory.

44. The cluster of claim 35, wherein each of the plurality of integrated circuits further comprises logic adapted to determine whether the code stored in the second programmable non-volatile memory matches the code stored in the first non-volatile memory.

45. The cluster of claim 44, wherein each of the plurality of integrated circuits further comprises circuitry adapted to disable some or all of the operating circuitry when the code stored in the second programmable non-volatile memory does not match a corresponding code stored in the first non-volatile memory.

46. The cluster of claim 35, wherein the second programmable non-volatile memory stores an initial code consisting of all zeroes or all ones.

47. The cluster of claim 35, comprising a single crystal silicon substrate, wherein the electrical interconnections between adjacent integrated circuits each comprise a diffusion layer in the substrate.

48. The cluster of claim 35, comprising a thin-film-transistor substrate, wherein the electrical interconnections between adjacent integrated circuits each comprise a polysilicon layer, a metal layer or a capacitor on the substrate.

49. An integrated circuit, comprising:
  a) a first type of non-volatile memory adapted to store an activation code;
  b) a second type of non-volatile memory that is programmable and capable of storing the same activation code;
  c) permanent pad terminals configured to connect to external devices; and
  d) temporary cluster terminals configured to connect to other devices on a common substrate prior to separating the integrated circuit from the other devices on the common substrate.

* * * * *